United States Patent [19]

Seno et al.

[11] Patent Number: 4,706,379
[45] Date of Patent: Nov. 17, 1987

[54] PARTS MOUNTING APPARATUS

[75] Inventors: Makito Seno, Hirakata; Yoshihiko Misawa, Katano; Yoshinobu Maeda, Katano; Kengi Fukumoto, Katano, all of Japan

[73] Assignee: Matsushita Electric Industrial Co., Ltd., Kadoma, Japan

[21] Appl. No.: 771,765

[22] Filed: Sep. 3, 1985

[30] Foreign Application Priority Data

Aug. 31, 1984 [JP] Japan .................. 59-183026

[51] Int. Cl.$^4$ ............................. H05K 3/30
[52] U.S. Cl. ........................ 29/740; 29/714; 340/686; 356/152; 356/394; 364/559
[58] Field of Search .......... 29/740, 741, 840, 715, 29/714; 340/555, 556, 686, 568; 356/138, 152, 150, 372, 375, 384, 394; 364/559, 478

[56] References Cited

U.S. PATENT DOCUMENTS

| 4,458,412 | 7/1984 | Dean et al. ............ | 29/740 X |
| 4,515,507 | 5/1985 | Asai et al. ............. | 29/740 X |
| 4,520,557 | 6/1985 | Harigane et al. ....... | 29/740 |

FOREIGN PATENT DOCUMENTS 58-53887 3/1983 Japan .
59-86299 5/1984 Japan .

Primary Examiner—Carl E. Hall
Attorney, Agent, or Firm—Wenderoth, Lind & Ponack

[57] ABSTRACT

A parts mounting apparatus has a plurality of suction nozzles for picking up and holding the parts, the nozzles intermittently moving along a closed path to stop positions arranged at predetermined set intervals along the path, including a parts pickup position at which parts are picked up by the suction nozzles and a parts mounting position at which parts are mounted on an article on which parts are to be mounted. A position adjusting device is provided between the parts pickup positions and the parts mounting position for adjusting the position of a part held on a suction nozzle to orient the part relative to the longitudinal axis of the suction nozzle in two directions at right angles to each other and perpendicular to the longitudinal axis of the nozzle. A parts posture detecting device is provided at a stop position downstream of the position adjusting device and which has a line sensor for detecting whether the posture of the parts relative to the suction nozzle axis is proper by sensing whether or not a part extends beyond a maximum position past the end of the corresponding nozzle. The suction of the suction nozzle is controlled for retaining or releasing the parts in accordance with whether the posture detecting device had detected that the part held by a nozzle is proper or not.

20 Claims, 23 Drawing Figures

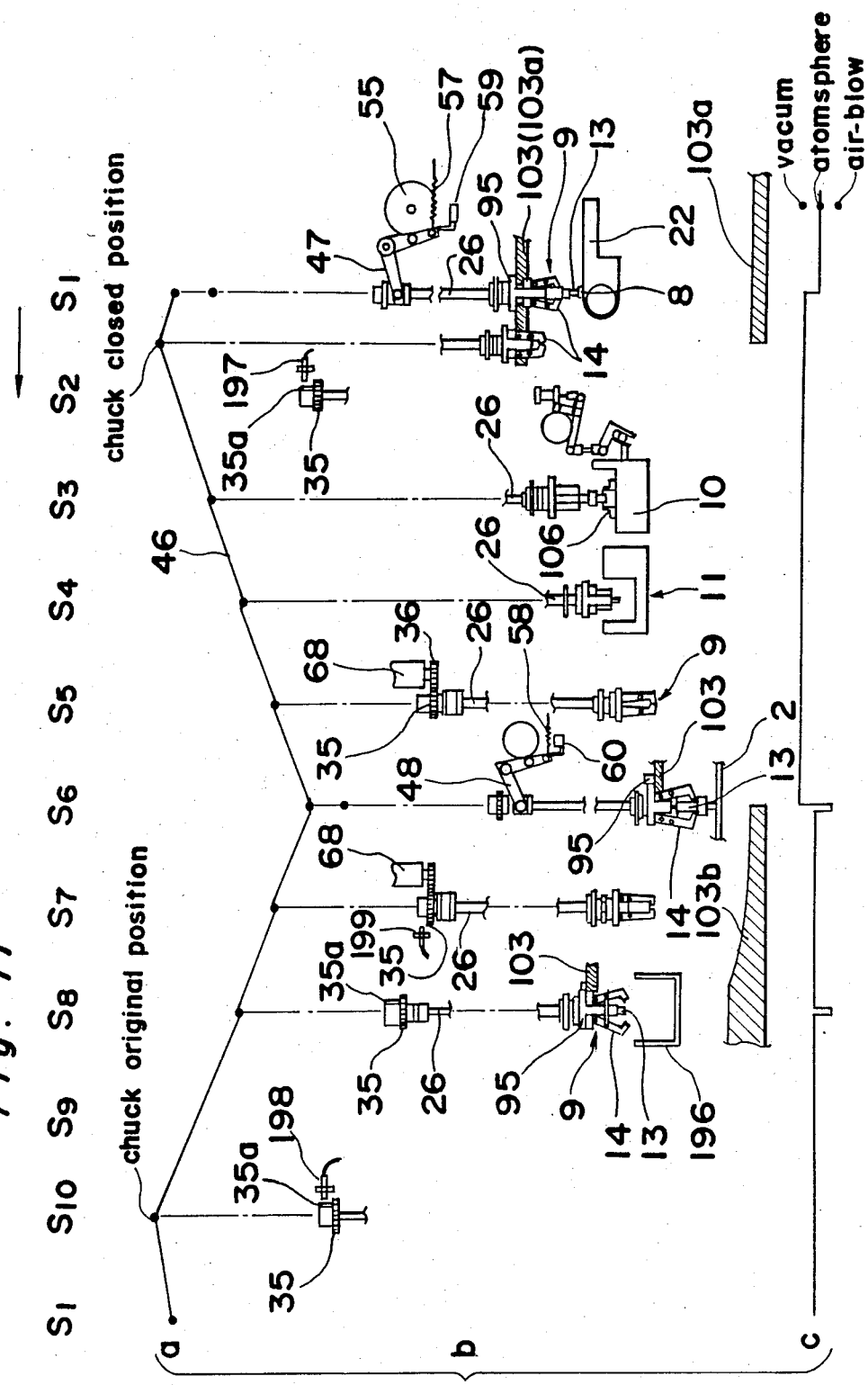

PARTS MOUNTING APPARATUS

BACKGROUND OF THE INVENTION

The present invention relates to an apparatus for mounting electronic parts and which is used in the mounting of microelectronic parts into an electronic circuit base plate.

Generally, there has been used a method comprising the steps of applying a bonding agent on the necessary locations of the circuit base plate, sequentially feeding the electronic parts onto the circuit base plate to bond them during the mounting operation, on the electronic circuit base plate. The parts can be leadless type microelectronic parts such as chip type resistors, chip type layer-built capacitors or the like. The circuit base plate with the electronic parts bonded thereon is electrically connected with solder dip.

An example of the prior art parts mounting apparatus is already disclosed in, for example Japanese Laid-open Patent Publication No. 59-86299 and is schematically shown in FIG. 1 of the accompanying drawings. as shown in FIG. 1, a plurality of suction nozzles E are intermittently moved in a circle, and the parts F are sequentially picked up and retained at a parts pickup or receiving position A and set in a first stop position, and are fed to a parts mounting position D, and have their positions adjusted in a first direction by a first position regulating means G at an intermediate stop position of the suction nozzle E along the circle and have their positions adjusted in a second direction by a position regulating means H which is provided at the next intermediate stop position of the suction nozzle E, the second direction being normal to the first direction and the two directions being at right angles to the center of the nozzle E so that the parts F retained on the nozzles are successively acted on to adjust their positions, and thereafter a bonding agent is applied to the parts F at the further intermediate stop position C.

As described hereinabove, the positional adjustment necessary for the parts mounting, and the bonding agent application in the respective stop positions during the period when the parts are intermittently fed from the receiving position to the mounting position allows the required number of operations to be sequentially performed with respect to the feed parts without any time lag or time extension because of the simultaneous necessary individual operatiosn at the respectively disposed suction nozzle stop stations for the number of the operations.

In the case of the prior art, only the operations such as positional adjustment in two directions at right angles to the nozzle on which the parts are held, and the bonding agent application to the parts are performed. But in the operation of handling small electronic parts 1.25 mm in width, 2 mm in length, and 0.5 mm in thickness, the electronic parts may be oscillated, laterally turned, or turned from side to side during the feeding process, during the waiting for the performance of an operation or by air currents. These facts may make the posture of the parts held on the suction nozzle uncertain, so that the parts may be tilted, laterally turned, or turned from side to side with respect to the proper posture. Thus, these parts may be mounted on the circuit board or the like with these parts still in an improper posture even after the parts have been adjusted in two directions. Once a part has been mounted in an improper posture, the entire unit such as the printed circuit board or the like becomes an unacceptable product, so that it must be discarded or one of the complicated microparts must be replaced, thus resulting in a lot of disadvantages.

SUMMARY OF THE INVENTION

Accordingly, a primary object of the present invention is to provide a parts mounting apparatus which is adapted to detect the axial rotational position around the axis of the suction nozzle, of parts retained on the nozzle, to prevent the improperly positioned parts from being mounted, without extra time lag and time extension during the movement of the parts to the parts mounting position from the parts receiving position by the intermittently moved suction nozzle.

A second object of the present invention is to provide a parts mounting apparatus wherein the posture is simply and correctly detected at one stop position of the suction nozzle.

A third object of the present invention is to provide a parts mounting apparatus wherein the prevention of mounting and handling of parts in an improper posture are achieved without the requirement for a special mechanism.

The other object of the present invention is to provide a parts mounting apparatus wherein the rotational position of the parts around the suction nozzle center can also be adjusted as well as the position in the two directions perpendicular to the suction nozzle axis without extra time and time extension during the parts moving operation from the parts receiving position to the parts mounting position.

The major characteristics of the present invention are that the present invention is provided with at least a plurality of suction nozzles for picking up and retaining the parts, a suction nozzle moving means which is provided with the respective nozzles to intermittently move the nozzles along a circulation path pitch by pitch, a position adjusting means which is adapted to adjust the lateral position of parts held by the suction nozzles in two directions at right angles to the suction nozzle axis of positions between a parts pickup or receiving position and a parts mounting position, a posture detecting means which is disposed at a stop position of each suction nozzle subsequent to the positions at which adjustment of the parts in two lateral directions takes place between the parts receiving position and the parts mounting position for detecting the posture of the parts relative to the suction nozzle axis, a suction regulating means which is adapted to control the suction to retain or release, the parts from the suction nozzle depending on the detected posture at the time the parts pass the mounting position.

Thus, both center alignment of the parts by two lateral direction positional adjustment with respect to the suction nozzle and the detection of the posture of the parts after the two lateral direction position adjustment are performed during the movement of the suction. nozzles from the parts receiving position to the parts mounting position. Only the parts which are in the proper posture and which have had the two lateral directional positions adjusted and thus only the parts which are in a proper posture, i.e. are not tilted, not laterally turned, and not turned from side to side with respect to a given position determined by the positional relation of the suction nozzle with respect to the circuit board or the like under the suction nozzle, are released at the parts mounting position. The parts which are in an improper posture are held under suction while they pass the parts mounting position and are not mounted, and they are released by a suction release operation a position after they have passed the parts mounting position.

Accordingly, only the parts which are in a proper posture are mounted in a proper position on the circuit board or the like, mounting of improperly postured parts being avoided so as to prevent production of circuit boards and the like of inferior quality. Also, because the posture of the parts is detected at a nozzle stop position between the parts receiving position and the parts mounting position, the detection may be achieved without any special time lag or time extension while still carrying out a posture detecting operation on each part. Especially since the detection of the posture is performed on parts which are held by the suction nozzle and which have had the two lateral direction positions adjusted, no error detection is made which is caused by the positional shift of the parts with respect to the detection object zone, thus ensuring higher reliability in the parts which is not in a proper posture are removed without being mounted and parts which are in a proper posture are mounted.

A second characteristic of the present invention is that a line sensor is used as a means for detecting the posture of the parts to detect the maximum size of the parts in the axial direction of the suction nozzle.

Therefore, the suitability of the posture may be correctly judged by measuring one dimension from the proper position to determine whether the maximum dimensions of the parts in the axial direction of the nozzle conforms to that of the parts in the proper posture.

A third characteristic of the present invention is that the parts suction regulating means is adapted to perform not only the regulating operation for suction applied to the suction nozzle, but also to perform regulating of the function of the fluid source which is jointly used in the mounting of the properly postured parts and the operation of removing the improperly postured parts which have passed the parts mounting position.

Thus, the separation of the properly postured parts from the suction nozzle and the mounting on the circuit board or the like in the parts mounting position, and the removal of the improperly postured parts from the suction nozzle in the removing position after the improperly postured parts have passed the parts mounting position are positively achieved without special means or mechanism by the use of suction nozzles and switching or change-over valves which are normally disposed in a fluid duct connected to the suction nozzles.

Still another characteristic of the present invention is that an angular position regulating means is provided which is adapted to adjust the angular position of parts carried by the suction nozzle around its axis by turning the suction nozzle around its axis through a given angle at a portion subsequent to the two lateral direction position adjustment postures between the parts receiving position and the parts mounting position.

Thus, the parts retained by the suction nozzles are rotated through a given angle while in the two lateral direction adjusted position on the suction nozzle so that the mounting posture of the parts with respect to the circuit board or the like may be properly adjusted without changes in the parts mounting position determined by the positional relation between the suction nozzle and the board.

BRIEF DESCRIPTION OF THE DRAWINGS

These and other objects and features of the present invention will become apparent from the following description of a preferred embodiment thereof taken in conjunction with the accompanying drawings, in which:

FIG. 11 is a schematic view of the developed path of the parts mounting head;

DETAILED DESCRIPTION OF THE INVENTION

Figure 1:
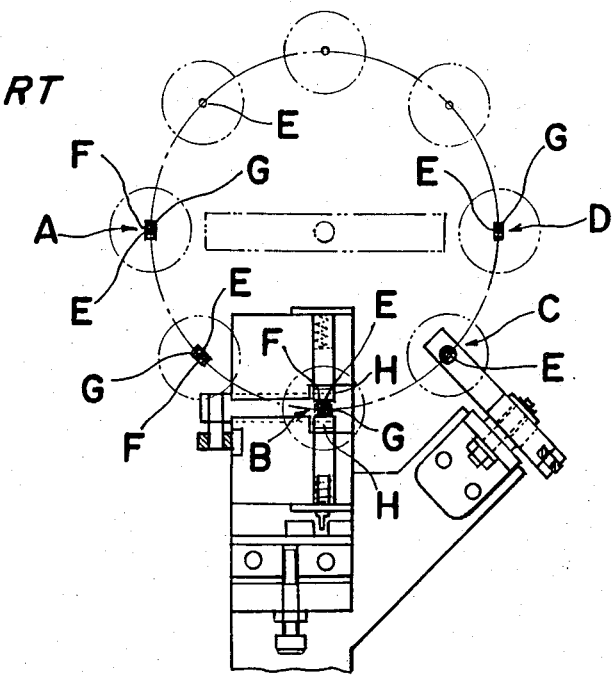
FIG. 1 is an explanatory plan view of a conventional parts mounting apparatus (already referred to)
Figure 2:
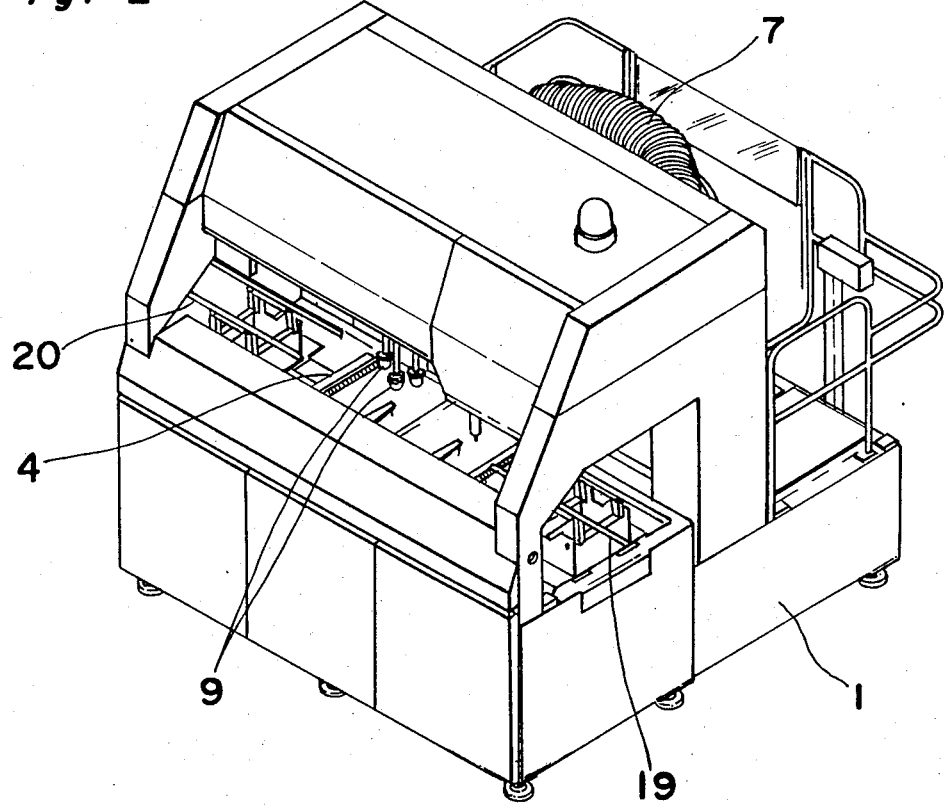
FIG. 2 is a perspective view showing one embodiment of the present invention.
Figure 3:
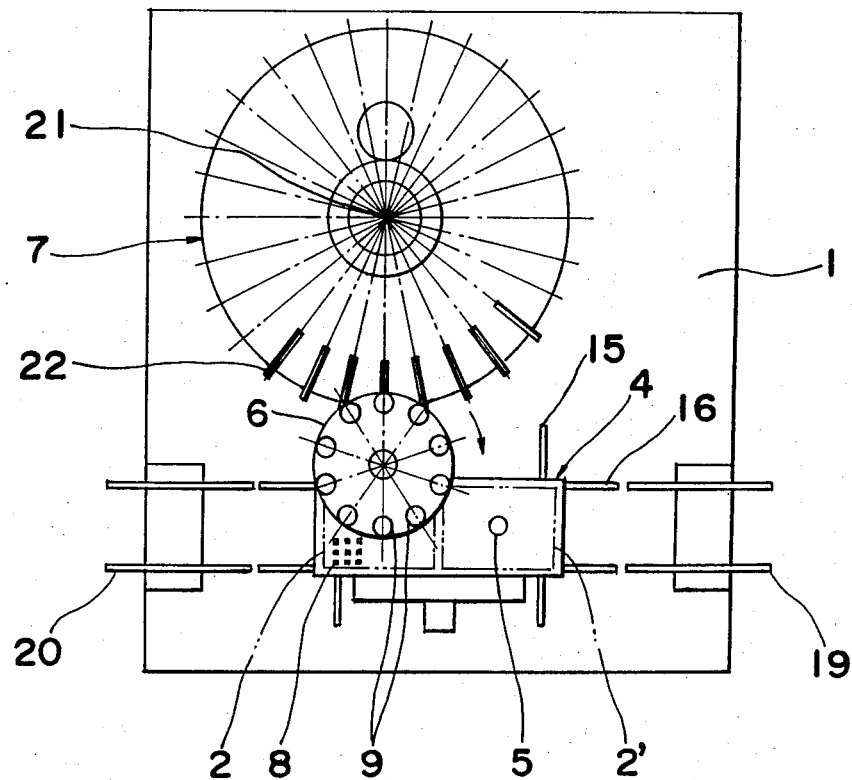
FIG. 3 is a schematic view of the embodiment of FIG. 2.
Figure 4:
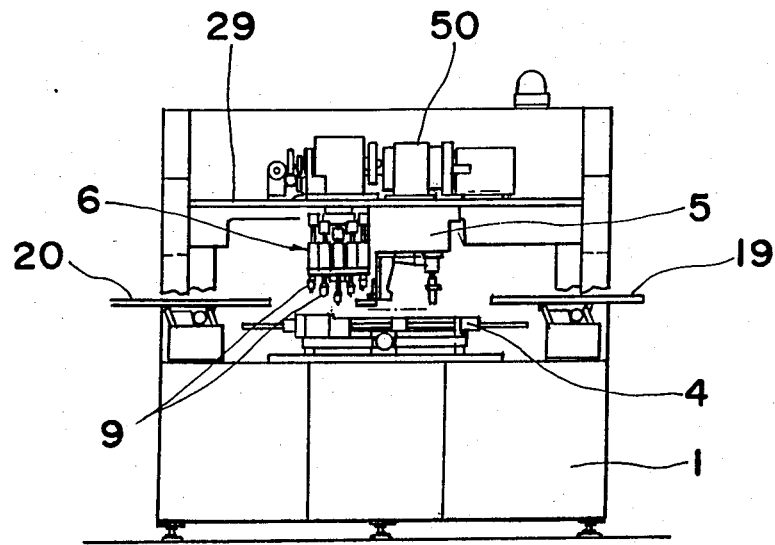
FIG. 4 is a front view of the embodiment of FIG. 2.
Figure 5:
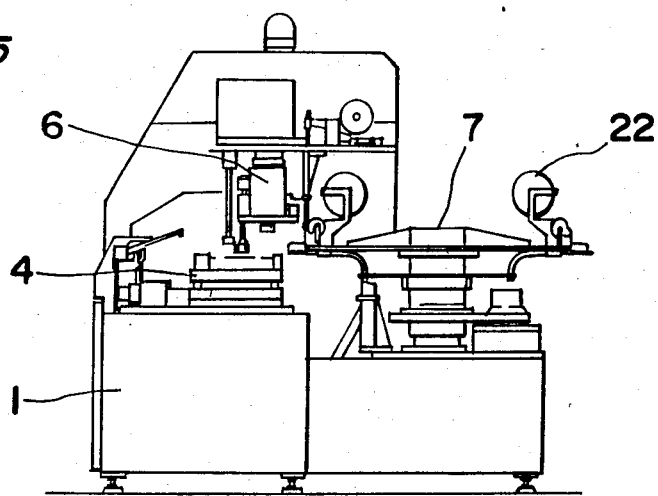
FIG. 5 is a side view of the embodiment of FIG. 2.

Before the description of the present invention proceeds, it is to be noted that like parts are designated by like numerals throughout the accompanying drawings.

Referring to FIGS. 2 through 5, an XY table 4 with two circuit base plates 2 and 2' being arranged on the right and left in the drawing is placed in the front portion of a base stand 1. A bonding agent applying apparatus 5 for applying the bonding agent and a parts mounting head 6 for mounting electronic parts 8 are placed in side by side relation, respectively, on the right-hand side circuit base plate 2' and on the left-hand side circuit base plate 2. A parts feed rotor 7 is disposed behind the parts mounting head 6. The parts mounting head 6 has ten or so chucks 9 disposed around the periphery thereof to hold the electronic parts 8 and is intermittently rotated around its vertical axial center at the pitch of the chucks 9. An upper portion driving means 50 for driving each portion and a head driving cam until 51 are provided on the head frame 29 of the base stand 1.

The XY table 4 is adapted to move in a lateral direction (X-axis direction) and a longitudinal direction (Y-axis direction). The XY table is composed of a Y table 4a (FIG. 6) which is provided on the longitudinal guide rails 15 and is adapted to move in the longitudinal direction (Y-axis direction) and an X table 4b which is provided on the lateral guide rails 16 (FIG. 2) and is adapted to move in the laterial direction X-axis direction). The Y table 4a and the X table 4b are driven respectively by motors 17 and 18 and a feed screw mechanism (not shown). Carry-in guide rails 19 for circuit base plates 2 and 2' and carry-out guide rails 20 are disposed on opposite sides of the XY table 4.

The X table 4b is adapted to hold a pair of opposite side edges of the circuit base plates 2 and 2' and has slack preventing support pins (not shown) therein to support the circuit base plates 2 and 2' from the base side. The support pins may be freely changeable in the XY direction during the driving operation by a pulse motor or the like.

The parts feed rotor 7 is rotatable around its vertical axis center 21 and has detachably mounted on its outer peripheral portion many parts feed cassettes 22. Each parts feed cassette 22 has a parts retaining tape 23 (FIG. 8) wound around a reel accommodated therein, the parts retaining tape having the electronic parts 8 mounted in one row. The parts feed cassette is adapted to intermittently deliver the parts retaining tape 23 at each of the parts arrangement pitches into an outlet portion 22a. Each of the parts feed cassettes 22 has a different type of electronic parts 8 accommodated therein.

Figure 7:
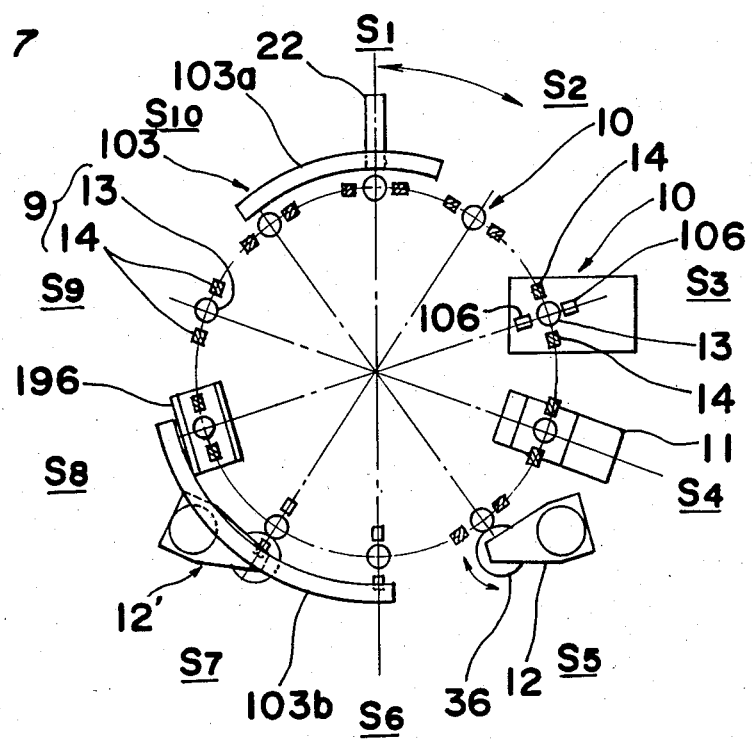
FIG. 7 is a schematic plan view of the mounting head of FIG. 6 for showing its operation.

Each chuck 9 of the parts mounting head 6 is composed of a suction nozzle 13 and a pair of regulating pawls 14 as shown in FIG. 7. The regulating pawls 14 are adapted to perform the lateral positional adjustment in one direction (X axis direction) of the electronic parts 8 held by the suction nozzle 13. The positional adjustment in the direction (Y axis direction) at right angles to the X axis direction is performed by a pair of regulating pawls 106 of a parts position regulating apparatus 10 disposed on the base stand 1.

Ten chuck stop positions S1 through S10 of the parts mounting head 6 are respectively a parts pickup or receiving position S1, a parts adjustment position for adjustment in the Y axis direction S3, a parts position detecting position S4, a chuck rotating position S5, a parts mounting position S6, a chuck rotating return position S7, and an improperly postured parts removing position S8. Also, the rotation section from S1 to S2 is a parts adjusting section for adjustment of the parts position in the X axis direction. A parts position adjusting apparatus 10 is disposed at the parts adjusting position S3 and a parts posture detection apparatus 11 is disposed at the parts detecting position S4. A chuck rotating apparatus 12 and the chuck return rotating apparatus 12' are respectively disposed at the chuck rotating position S5 and the chuck return rotating position S7. A parts receiving box 196 is placed at the parts removing positoin S8. Sensors 97 and 98 (FIG. 11) are provided in the stop positions S2 and S10, which are detecting position for detecting the original chuck rotation position. A sensor 99 (FIG. 11 is provided at the parts removing position S8, which is also a chuck return rotation detecting position. Reference numeral 104 designates a fixed cam for opening and closing the chuck.

Figure 6:
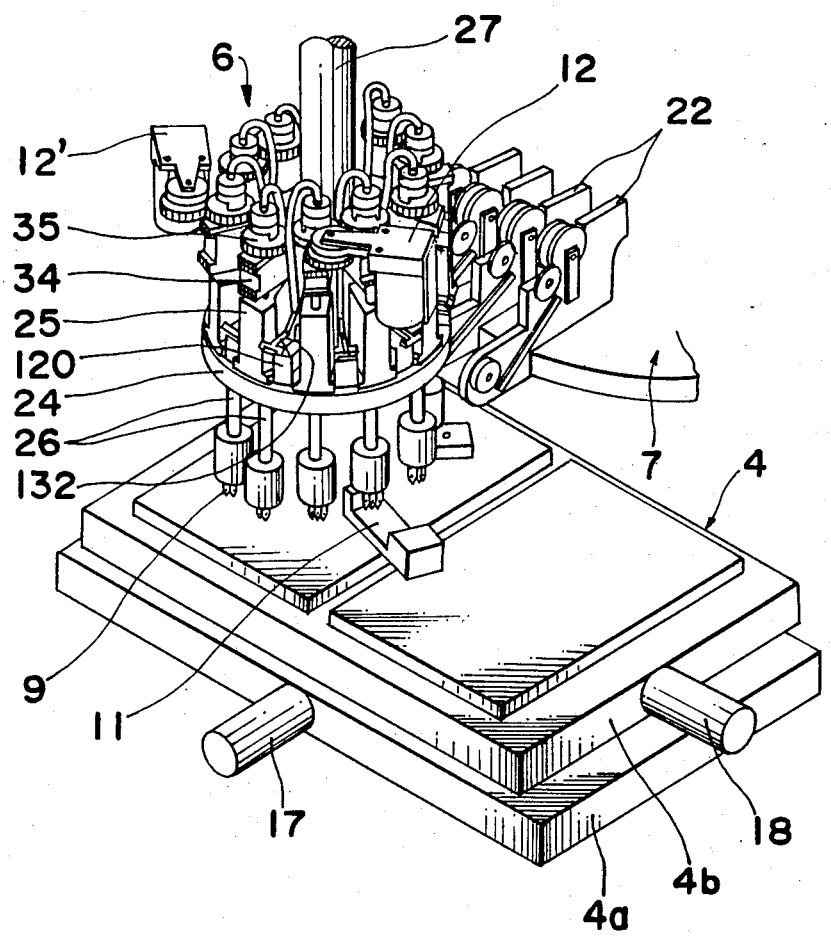
FIG. 6 is a perspective view showing a parts mounting head of the apparatus of FIG. 2.
Figure 8:
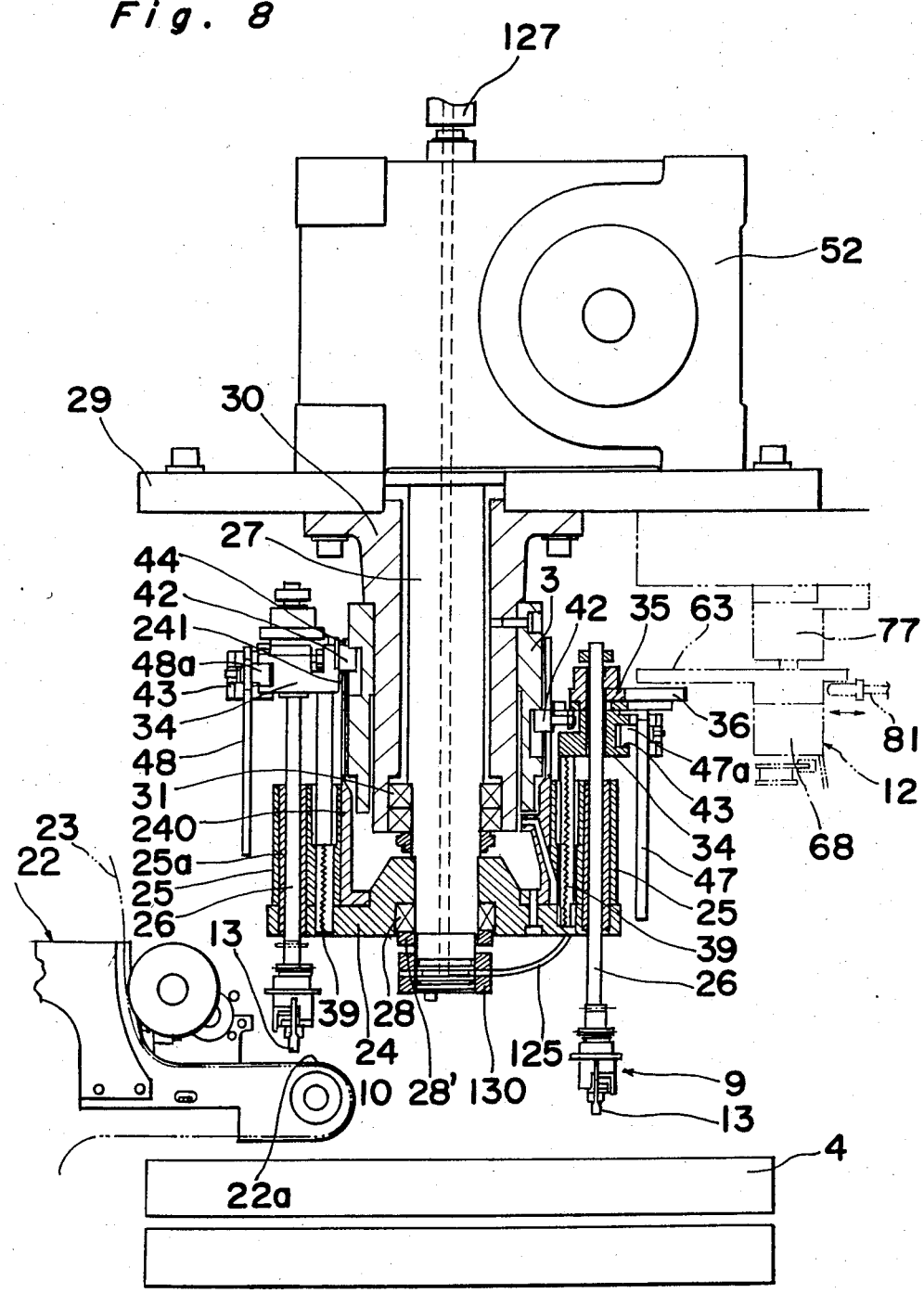
FIG. 8 is a vertical sectional view of the parts mounting head shown in FIG. 6.

The parts mounting head 6 has a plurality of chuck mounting shafts 26 mounted liftably and rotatably on the outer peripheral portion of the rotary frame 24 in slide bearings 25 as shown in FIG. 6 and FIG. 8. Each slide bearing 25 has a bearing sleeve 25a. A chuck 9 is provided at the lower end of each chuck mounting shaft 26. The rotary frame 24 is secured by a nut 28' on a rotating main shaft 27 through a clamp element 28. The rotating main shaft 27 is rotatably supported by a bearing 31 in a cylindrical main shaft housing 30 projected from the bottom face of the head frame 29 of the base stand 1.

Figure 9:
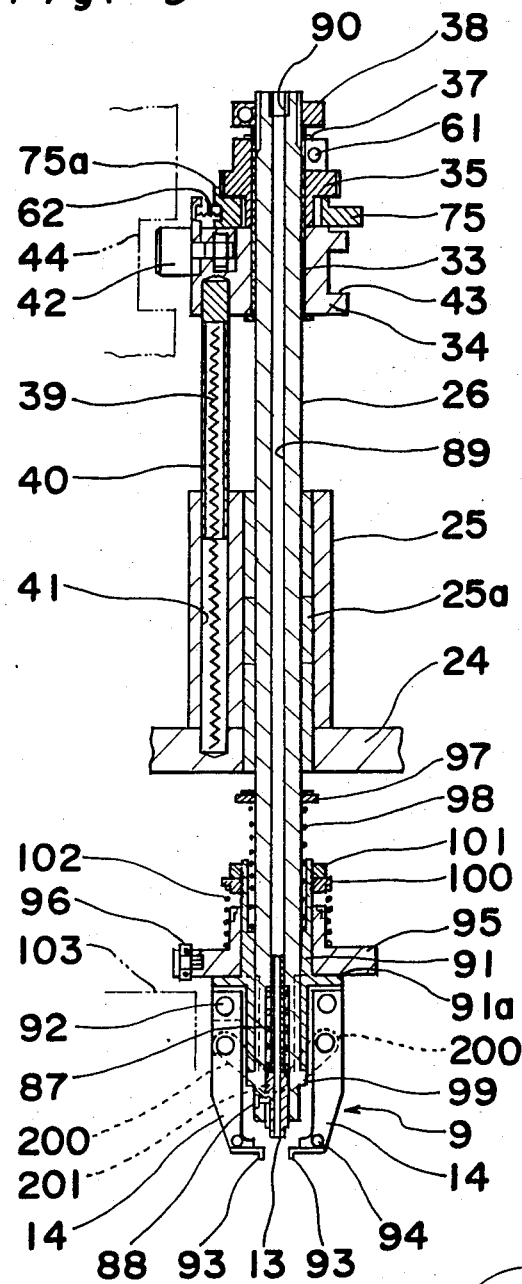
FIG. 9 is an expanded sectional view of a chuck provided on the parts mounting head and the mounting shaft portion thereof.
Figure 10:
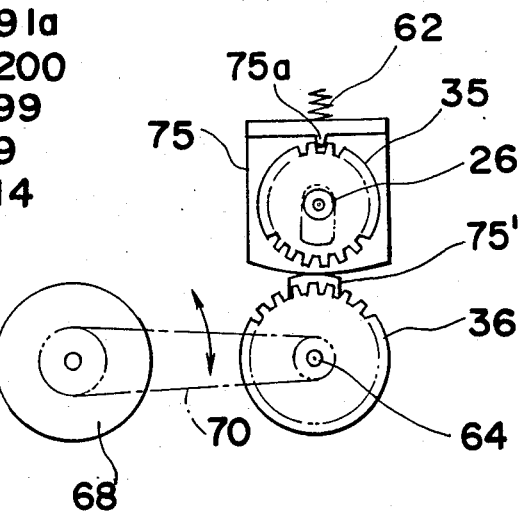
FIG. 10 is a plan view of a rotation driving mechanism for the chuck mounting shaft.

As shown in FIG. 9, each chuck mounting shaft 26 has a sleeve 33 externally mounted on its upper portion, a vertically driving block 34, a chuck rotating gear 35, and a rotation locking member 75 externally mounted on the sleeve 33. They are prevented from coming off the sleeve 33 by a C-shaped retaining ring 37. The chuck rotating gear 35 is adapted to be engaged with the chuck driving gear 36 of a chuck rotating apparatus 23 (FIG. 7). As shown in FIG. 10, the chuck rotating apparatus 12 has a gear 36, movable toward and away from gear 35 and mounted vertically on a support shaft 64 driven through a belt or cam 70 from a pulse motor 68. The gear 36 is engagable with the gear 35. A lock open dog 75' on shaft 64 is engagable with a rotation locking member 75 which is slidable transversely to shaft 26 against the elasticity of a spring 62 to release the engagement of a locking pawl 75a on locking member 75 from the gear 35 to permit gear 35 to rotate. When the gear 36 is separated from the gear 35 to disengage it, the pushing against the member 75 by the lock dog 75' is released. The member 75 with locking pawl 75 is doubled-acted by the spring 62 to lock the gear 35 again. As a result, the gear 35 is positively locked or released in accordance with the engagement or disengagement of the gear 36. The rotation of the gear 36 is positively transmitted to the chuck mounting shaft 26, so that the rotation position is correctly maintained. Also, a groove 35a is provided in the boss portion of the chuck transmission gear 35 which can be detected by sensors 197 and 198 (FIG. 11) for detecting the original rotational position. The upper end of the sleeve 33 is engaged with a chuck mounting shaft vertical adjustment nut 38 engaged with the top end of the chuck mounting shaft 26. The weight of the chuck mounting shaft 26 is supported by a chuck mounting shaft lifting spring 39 through a vertically driving block 34. The chuck mounting shaft lifting spring 39 is accommodated within a cylindrical rotation stop and spring retaining shaft 40. The rotation stop and spring retaining shaft 40 is slidably inserted into a guide hole 41 formed in the sliding bearing 25 of the chuck mounting shaft 26.

Figure 22:
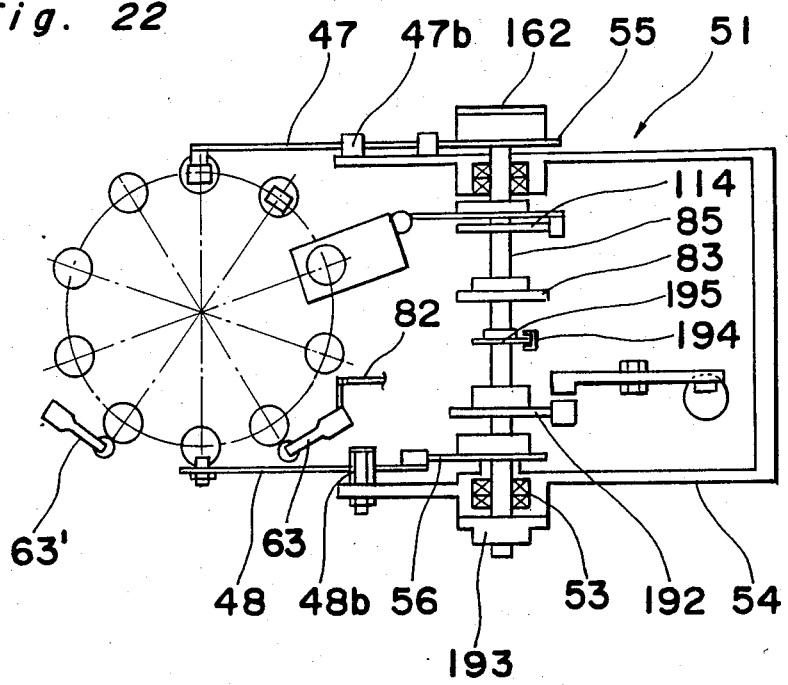
FIG. 22 is a plan view of a head driving cam unit of the driving portion of FIG. 21.

A cam follower 42 is rotatably engaged with the vertical driving block 34 and a vertically driving groove 43 is formed in the block 34. The cam follower 42 is engaged with a fixed groove-shaped chuck lifting cam 44, which is provided around the entire periphery on a fixed cam cylinder 3 on the outer periphery of the main shaft housing 30 (FIG. 8). The chuck lifting cam 44 is adapted to properly maintain the chuck height with respect to each part of the parts position regulating apparatus 10, the parts detecting apparatus 11 or the like disposed at the respective chuck stop positions S1 through S10, and has a cam shape 46 shown in developed form in FIG. 11. If each part of the parts position regulating apparatus and so on is at a constant height, the chuck lifting fixed cam 44 is not necessary. The vertically driving groove 43 of the vertically driving block 34 has engaged therein the engaging rollers 47a and 48a of a suction cam level 47 (FIG. 8) and an engaging cam lever 48 provided in the parts receiving position S1 and the parts mounting position S6. The engagement rollers 47a and 48a are engaged in a guide hole 241 provided in the vertical direction in the sliding guide 240 and are prevented from being vibrated by the guide hole 241. The sliding guide 240 which is cylindrical is loosely engaged on the outer periphery of the fixed cam cylinder 3 and is secured on the rotation frame. A guide hole 241 is provided for each of the chuck mounting shafts 26. The suction cam lever 47 and the engaging cam lever 48 are supported for vertical pivotal operation around the support shafts 47b and 48b on the came case 54 of the head driving cam unit 50 as shown in FIG. 22, and are respectively driven by the suction cam 55 and the engaging cam 56. The suction cam lever 47 and the engaging cam lever 48 are pressed against the suction cam 55 and the engaging cam 56 respectively by depressing springs 57 and 58 (FIG. 11) and can be separated from the cam face by cylinders 59 and 60 by stoppers thereon.

It is to be noted that the head driving cam unit 50 will be described later.

In FIG. 9, the chuck rotating gear 35 is clamped integrally with the chuck mounting shaft 26 by a clamping bolt 61. The rotation locking member 75 is slidably mounted on driving block 34 for free advancing or retreating motion in the diametral direction of the chuck rotating gear 35 and is provided with the locking pawl 75a which is removably engagable with the chuck rotating gear 35. The rotation locking member 75 is urged in the direction in which the locking pawl 75a is always engaged with the gear 35 by the locking spring 62 provided between the vertically driving block 34 and pawl 75, and normally locks gear 35 against rotation. The chuck rotating gear 35 can be rotated by engagement by gear 36 after the rotation locking member 75 is moved against the action of locking spring 62.

Figure 16:
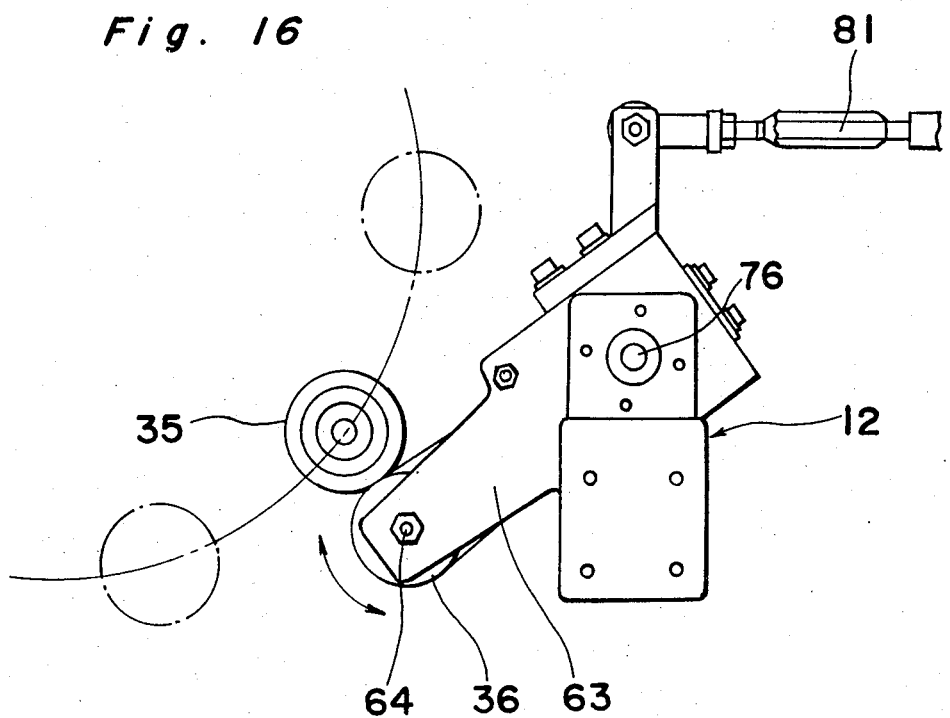
FIG. 16 is a plan view of the chuck rotating mechanism.
Figure 17:
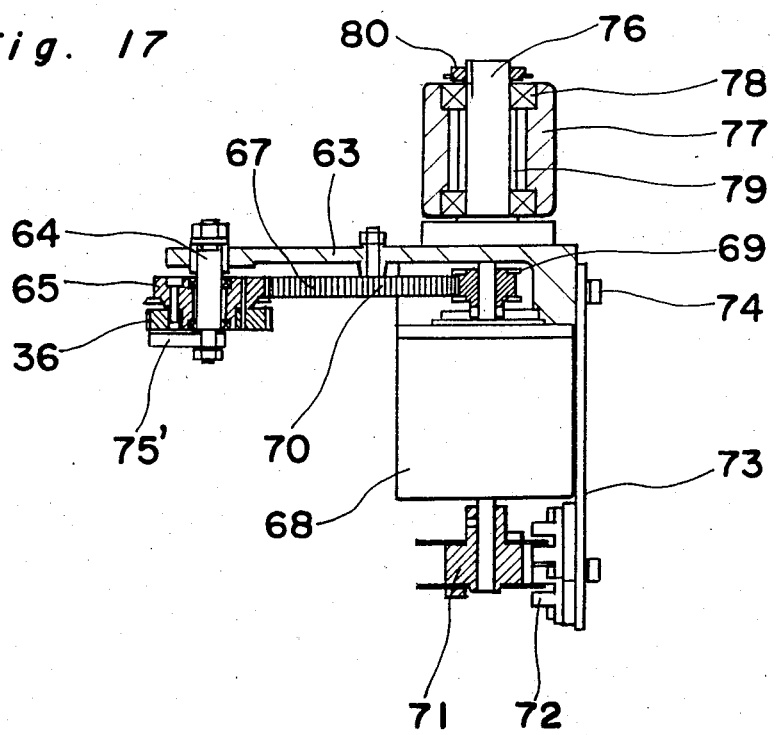
FIG. 17 is a sectional view of the mechanism of FIG. 16.

As shown in FIGS. 16 and 17, the chuck rotating apparatus 12 has the chuck driving gear 36, which is engagable with the chuck rotating gear 35, mounted on the tip end of a pivotal lever 63. The chuck driving gear 36 may be engaged with or disengaged from the chuck rotating gear 35 by the pivotal movement of the pivotal lever 63. The chuck driving gear 36 is engaged integrally with a pulley 65 on the support shaft 64 and is driven by a pulse motor 68 through a timing belt 67. Reference character 69 designates a pulley of the pulse motor 68. Reference character 70 designates a tension pulley. The pulse motor 68 is secured to the pivotal lever 63. A rotation detecting plate 71 is mounted on the pulse motor 68 and a sensor 72 is secured to the pivotal lever 63 by screws 74 through a sensor retaining plate 73. Also, the lock open dog 75', which depresses the locking member 75 (FIG. 9), is mounted on the support shaft 64 of the chuck driving gear 36. The support shaft 76 of the pivotal lever 63 is rotatably supported in a bearing 78 on the support member 77. Reference character 79 designates a collar. Reference character 80 designates a bearing fixing nut. The support member 77 is secured to the head frame 29 (FIG. 8) of the base stand 1. The pivotal driving operation of the pivotal lever 63 is performed by a cam lever 82 (FIG. 22) coupled through a tie rod 81. The cam lever 82 is vertically pivotal and is pressed against the chuck rotating apparatus operating cam 83 by a cylinder (not shown) for cam face engagement. A chuck rotating apparatus operating cam 83 is mounted on a main cam shaft 85 and is rotatably driven.

Figure 21:
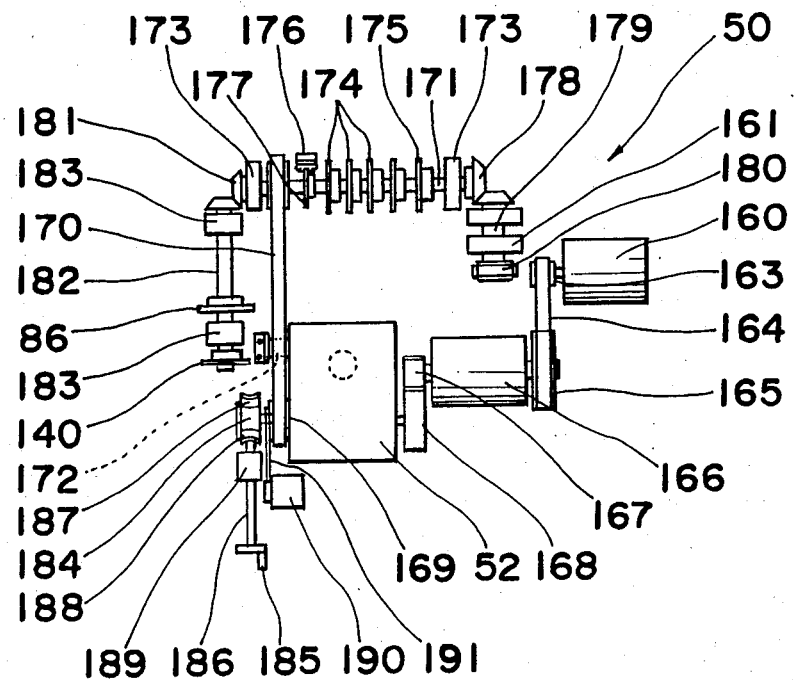
FIG. 21 is a plan view of an upper-portion driving means for the valve of FIGS. 20(A) and 20(B)

The chuck return rotating apparatus 12' is constructed the same as the chuck rotating apparatus 12. The pivoting operation of the pivoting lever 63' of the chuck return rotating apparatus 12' is performed by a cam lever (now shown) driven by the chuck return rotating cam 86 (FIG. 21).

As shown in FIG. 9, the chuck 9 is provided with downwardly directed suction nozzle 13 disposed at the lower end of the chuck mounting shaft 26 and a pair of regulating pawls 14 for grasping the electronic parts 8 held on the nozzle. The nozzle 13 is mounted for free movement into and out of the nozzle receiving hole of the chuck mounting shaft 26 and is urged outwardly by a spring 87. The nozzle engaged the electronic parts 8 and retracts in accordance with the height of the electronic parts 8. Reference numeral 88 designates a turning stop and vertical height regulation pin of the nozzle 13. The nozzle 13 is communicated with a suction passage 89 located within the chuck mounting shaft 26 and a piping coupling portion 90 is provided at the top end of the chuck mounting shaft 26. The regulating pawls 14 are coupled for free opening and closing movement around a pawl opening and closing support point 92 on the main body 91 of a regulating portion. A parts contact member 93 is mounted on the tip end of each pawl 14 by a clamping screw 94. The regulating portion main body 91 is externally freely vertically mounted on the chuck mounting shaft 26. A pawl opening and closing ring 95 is externally freely vertically mounted on the outer periphery of the regulating portion main body 91. The pawl opening and closing ring 95 is coupled to the mutual coupling point 201 of two links 200, one connected to each regulating pawl 14. The pawl opening and closing ring 95 and each chuck mounting shaft is vertically moved relative to the regulating portion main body 91 to open and close the regulating pawls 14. A cam follower 96 is rotatably mounted on each pawl opening and closing ring 95. The regulating portion main body 91 is downwardly urged by a compressed spring 98 supported by a spring retaining collar 97 or the chuck mounting shaft 26, and is engaged at its lower end with a stopper flange 99 on the chuck mounting shaft 26. A spring retaining collar 100 is externally engaged with the top end of the regulating portion main body 91 and is fastened with a nut 101. The pawl opening and closing ring 95 is depressed by a pawl opening and closing spring 102 disposed between the spring retaining collar 100 and the closing ring and is in contact against the upwardly facing side 91a of the regulating portion main body 91. The compression spring 98 has a larger spring constant than the pawl opening and closing spring 102. The cam follower 96 comes into rotating contact against the top face of a fixed chuck opening and closing cam 103. The chuck opening and closing fixed cam 103 is mounted under the parts mounting head 6 independent of the head 6 and extending along the cam cylinder 3 on the outer periphery of the main path of the chucks 9. The portions of the periphery along which the chuck opening and closing cam 103 is disposed is a portion 103a from the stop position S10 to just ahead of the stop position S2 and a portion 103b from the mounting position S6 to the parts removing position S8 as shown in FIGS. 7 and 11. The chuck opening and closing cam portion 103a has a cam surface for causing the regulating pawls 14 of the chuck 9 to be slowly closed. The cam surface is designed in accordance with the cam surface 46 of the fixed cam 44 for vertical motion of the chuck.

Figure 12:
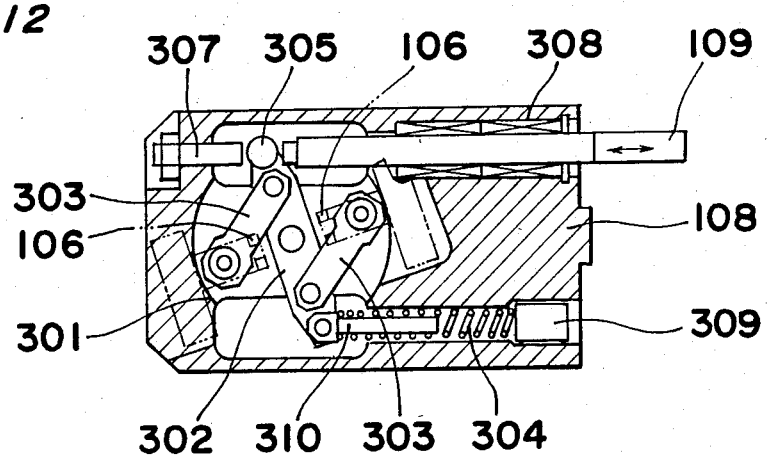
FIG. 12 is a cross-sectional view showing a position regulating member disposed in a given position and the driving system therefor.
Figure 13:
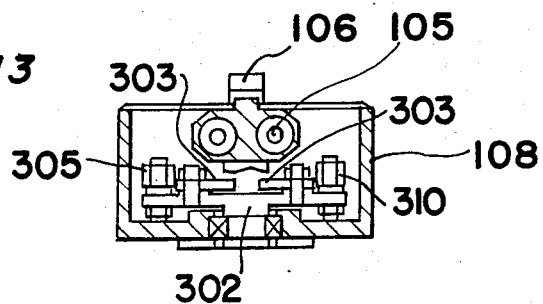
FIG. 13 is an enlarged section view of a portion of an operation mechanism for the position regulating member of FIG. 12.
Figure 14:
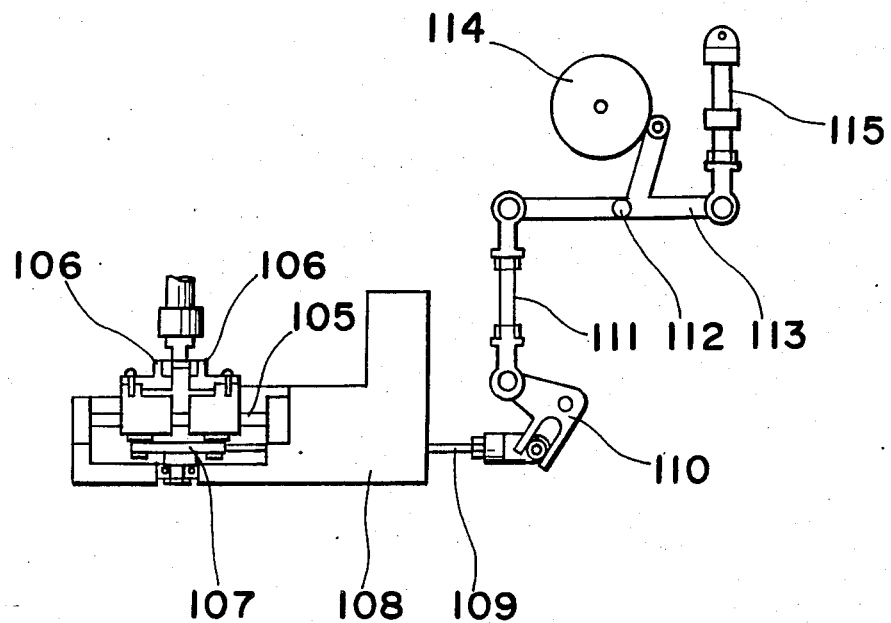
FIG. 14 is a partial sectional view of FIG. 13.

As shown in FIGS. 12 through 14, the parts position regulating apparatus 10 has a pair of regulating pawls 106 slidable along the guide shaft 105 and a link mechanism 107 for moving these regulating pawls 106 toward and away from each other. Reference numeral 108 designates a regulating apparatus body. The opening and closing direction of the regulating pawls 106 is assumed to be in the radial direction of the parts mounting head 6, which is a direction at right angles to the opening and closing direction of the regulating pawls 14 on the chuck 9. The driving of the link mechanism 107 is performed by the rotation of a regulating cam 114 through a coupling rod 109 connected to link mechanism 107, a pivotal lever 110 connected to rod 109, a coupling rod 111 connected to lever 110, and a regulating cam lever 113 pivotal around the support point 112. The regulating cam lever 113 is pressed against the regulating cam 114 by a cylinder 115 for following the cam surface thereof. Describing the parts position regulating apparatus 10 in further detail, the link mechanism 107 is composed of a regulating lever 302 pivotal around the support shaft 301, a pair of links 303 connecting the regulating pawls 106 with the vicinity of the opposite ends of the regulating lever 302 respectively. The regulating lever 302 is urged at its one end in the direction for closing the regulating pawls 106 by a regulating spring 304. The regulating pawls 106 may be opened by urging of the pin 305 on the other end of lever 302 by the tip end of the coupling rod 109. Reference numeral 307 designates a stopper, reference numeral 308 designates a slide bearing for the coupling rod 109, reference numeral 309 designates a spring retaining screw, and reference numeral 310 designates a spring retaining rod.

Figure 15:
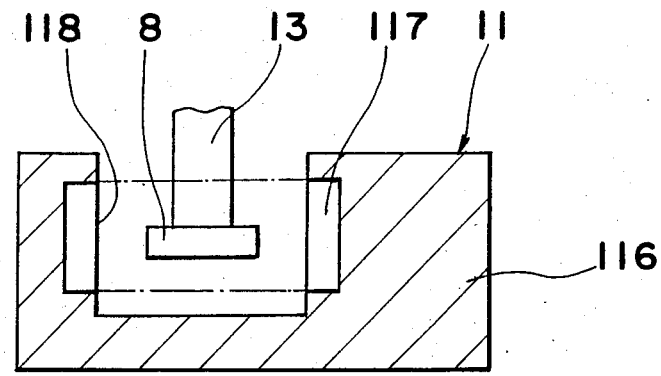
FIG. 15 is a sectional view of a parts posture detecting mechanism disposed in a given position.

As shown in FIG. 15, the parts posture detecting apparatus 11 has a light source 117 and a line sensor 118 oppositely disposed on the inner face of a ⊐-shaped main body 116. The line sensor 118 detects whether or not electronic parts 8 held by the suction nozzle 13 are located in a given height range to detect whether or not the electronic parts 8 are properly held by the suction nozzle 13.

Figure 19:
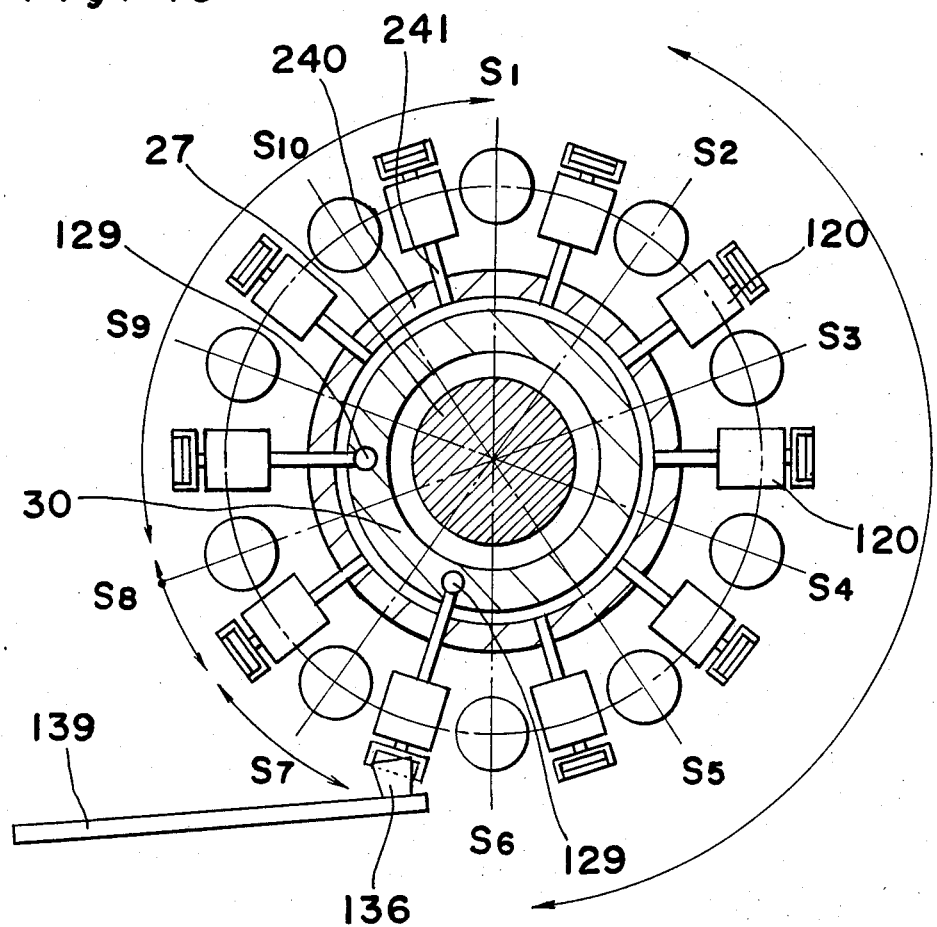
FIG. 19 is a plan view showing the suction control means of the parts mounting head.
Figure 20:
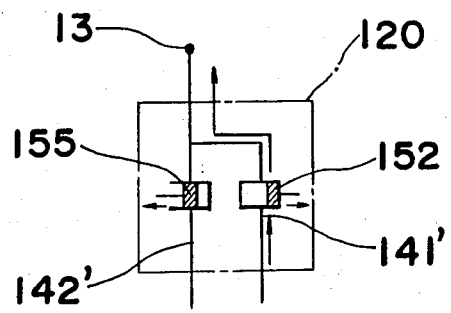
FIGS. 20(A) and 20(B) are schematic views illustrating the operation of a change-over valve in the means of FIG. 19.
Figure 20:
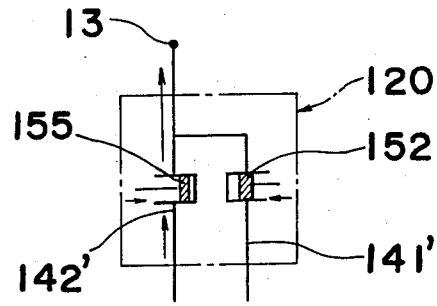

The air flow path through the suction nozzle 13 will be described hereinafter. The nozzle 13 may blow out compressed air to remove the parts at the parts mounting position S6 and the improperly postured parts removing position S8. A switching valve 120 (FIGS. 19 and 20) is provided in the air flow passage. The switching valve 120 has a valve body 152 of a negative pressure passage 141' normally open and the valve body 155 of a positive pressure path 142' normally closed as shown in FIG. 20(A). By actuation of a valve operating lever 132 the open and closing conditions are reversed as in FIG. 20(B).

Figure 18:
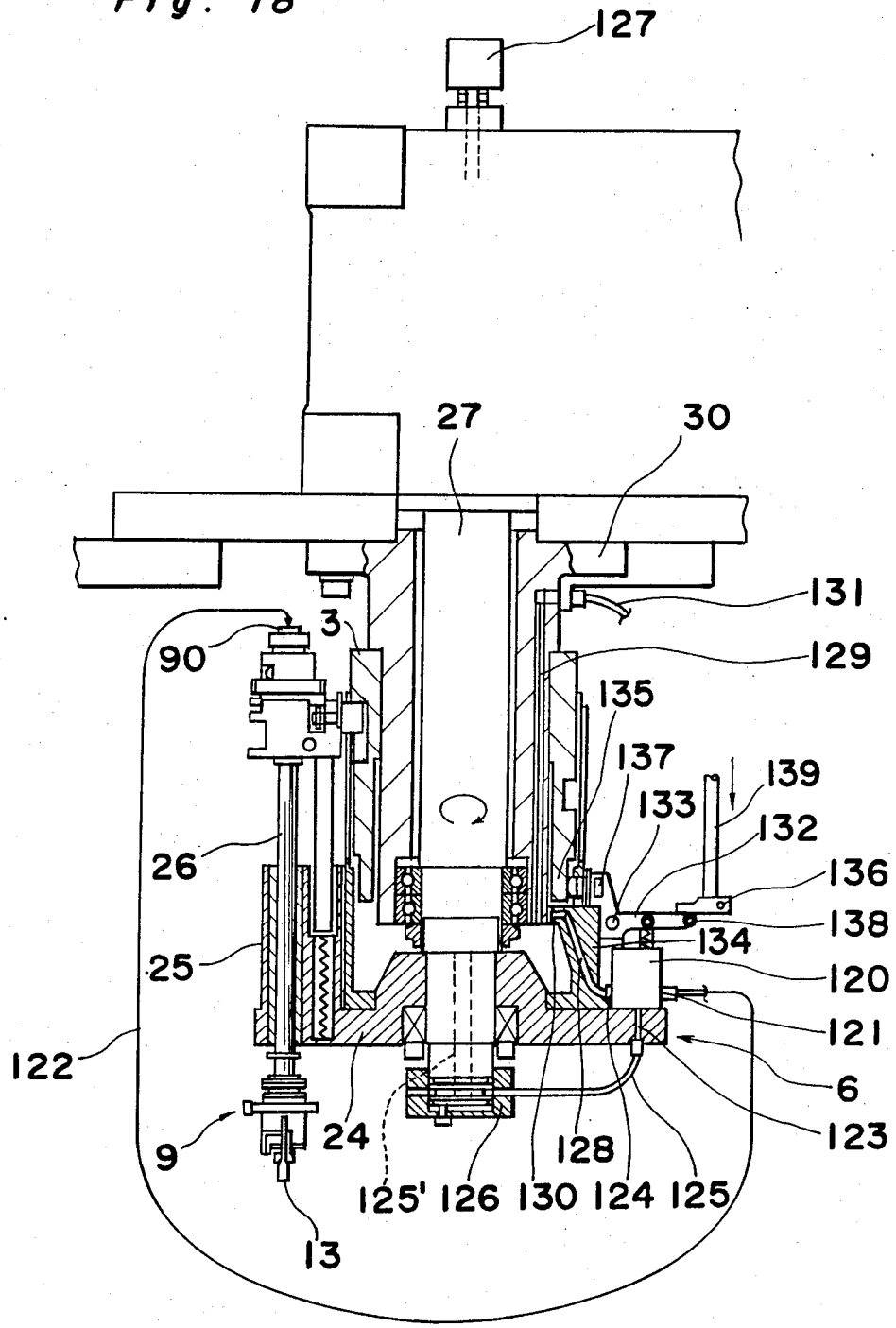
FIG. 18 is a sectional view of the parts mounting head taken at a different angle from that of FIG. 8.

The switching valve 120 is located between each of the pairs of respective chuck mounting shafts 26 and mounted on the rotary frame 24 of the parts mounting head 6. The air path will be described hereinafter with reference to FIG. 18. A flexible pipe 122 is connected with the piping connecting portion 90 on the top end of each chuck mounting shaft 26 from the outlet 121 of the switching valve 120. The negative pressure inlet 123 on the under face of the switching valve 120 is connected with a vacuum manifold 126 on the lower end of the main rotation shaft through a pipe 125. The manifold 126 is connected with a negative pressure path 125' within the main shaft and extending through the main rotation shaft 27. The top end of the negative pressure path 125' within the main shaft is connected by piping with the negative pressure source through a rotary joint 127. The positive pressure inlet 124 of the switching valve 120 is communicated with the positive pressure path within the housing of the main shaft housing 30 from the rotary frame positive pressure path 128 within the rotary frame 24. The positive pressure path 129 within the housing is provided only at the parts mounting position S6 and the improperly postured parts removing position S8. When the positive pressure path 128 is connected to the positive pressure path 129 within the housing through the rotation of the rotary frame 24, both the positive pressure routes 128 and 129 are communicated with each other at 130. The positive pressure path 128 within the rotary frame is open to the atmosphere in the non-communicated condition. The positive pressure path 129 within the housing is connected at its top end with a compressed air feed source through a pipe 131.

The valve operating lever 132 for each switching valve 120 is formed in an L-shape, is pivotally supported on the valve main body 134 on a support point pin 133, and is pivotable by a fixed cam 135 which is in contact with a vertical piece portion or through the control of a lateral piece by a vertical dog 136 for valve operation. A cam follower 137 is engaged on the vertical piece and a roller 138 for dog contact is mounted on the lateral piece. The valve opening and closing fixed cam 135 is provided on the outer peripheral face of the fixed cam cylinder 3 on the outer periphery of the main shaft housing 30. The range of lowering by the valve operation lever 132 of the fixed cam 135 is from the parts mounting position S6 to the parts receiving position S1 as shown in FIG. 11. The vertical dog 136 is provided at the parts mounting position S6 and is vertically divided through the pivotal operation of the cam 140 (FIG. 21) through the lever 139.

The relationship between the upper portion driving unit 50 (FIG. 4) and the head driving cam unit 51 will be described hereinafter. As shown in FIG. 21, the upper portion driving unit 50 is provided with a motor 160 as the single driving source. The rotation is transmitted to the pulley 162 of the main cam shaft 85 of the head driving unit 51 (FIG. 22) through a timing belt (not shown) by a pulley 161 to which rotatin is transmitted through each member from the motor 160. The motor 160 of the upper portion driving unit 50 is connected to an index unit 52 through a pulley 163, a timing belt 164, a pulley 165, a clutch brake 166, and gears 167 and 168. The index unit 52 is adapted to carry out the intermittent indexing rotation of the parts mounting head 6. The pulley 169 on the output side of the index unit 52 is coupled to the cam shift 171 by the timing belt 170. The timing belt 170 is engaged at its middle with a tension pulley 172. A cam 174 for driving each portion of the parts feed cassette 22 and cam 175 for driving a switch valve 120 are mounted on shaft 171. Also, a dog corresponding to a rotation detecting sensor 176 for confirming the rotation is mounted on shaft 171. One end of the cam shaft 171 is coupled to the rotation shaft 179 of the transmitting pulley 161 for the head driving cam unti 51 through a bevel gear mechanism 178. Reference numeral 180 designates a bearing. The other end of the cam shaft 171 is coupled to the cam shaft 182 of the driving cam lever for the chuck return rotating apparatus 12' through the bevel gear mechanism 181. A cam 140 for valve operation which operates the vertical dog 136 of the switching valve 120 is further secured to the cam shaft 182. Reference character 183 designates a bearing. The output shaft 104 of the index unit 52 is connected with the rotary shaft 186 of a manual handle 185 for adjustment through a worm wheel 187 and a worm 188. A one-direction clutch is incorporated in the worm wheel 187. Reference character 189 designates a bearing. Also, the output shaft 184 of the index unit 52 is connected with an electro-cycle timer 190 by the timing belt 191. The electro-cycle timer 190 is provided to control the timing of the operation of each portion.

The head driving cam unit 51 has a main cam shaft mounted on the case 54 in the bearings 53. The main cam shaft 85 has a regulating cam 114 for the parts position regulating apparatus 10, a chuck rotating apparatus operating cam 83 for the chuck rotating apparatus 12, a vertical cam 192 for the bonding agent applying apparatus 5 mounted in its middle, and is provided at both ends with a suction cam 55 and an engaging cam 56, which are adapted to respectively drive suction cam lever 47 for lifting the chuck mounting shaft 26 and the engaging cam lever 48. A brake 193 is further provided on the main cam shaft 85 and a dog 195 corresponding to the rotary sensor 194 for confirming the rotation is secured to the main cam shaft.

The operation of the above-described apparatus will be described hereinafter. In general, the right-hand circuit base plate 2' in FIG. 3 of the XY table 4 is moved in from the right. The bonding agent is applied to the circuit base plate by the bonding agent applying apparatus 5. The left-hand circuit base plate 2 on the XY table 4 has been moved leftward on the XY table 4 after the bonding agent application is completed by the bonding agent applying apparatus. The electronic parts 8 are mounted at the location where the bonding agent has been applied by the parts mounting head 6. The bonding agent applying operation and the parts mounting operation are performed in synchronous relation.

The parts mounting operation will be described hereinafter. As shown in FIG. 11, the chuck mounting shaft 26 moves downwardly in the parts receiving position S1 to pick up an electronic part 8 from the parts cassette 22 by the suction nozzle 13. The descent of the mounting shaft 26 at this time is performed by the lowering operation of the suction cam lever 4 by engagement of the roller 47a thereon in the groove 43 in the driving block 34. As the chuck mounting shaft 26 starts to move down, the regulating portion main body 91 moves down together with the chuck mounting shaft 26, compressing the spring 102 for opening and closing the pawls 14, because the compression spring 98 (FIG. 9) is stronger than the spring 102. It is to be noted that the ring 95 for pawl opening and closing is engaged with the fixed cam 103 for pawl opening and closing by the cam follower 96 and is retained at a constant height. Thus, regulating pawls 14 coupled by the links 200 to the pawl opening and closing ring 95 open. Thereafter, the chuck mounting shaft 26 keeps moving down. When the spring retaining collar 100 comes into contact with the pawl opening and closing ring 95, the regulating portion main body 91 cannot move down any further. Only the chuck mounting shaft 26 keeps moving down, compressing the lowering spring 98. Accordingly, the suction nozzle 13 of the lower end of the chuck mounting shaft 26 projects downwardly from the regulating pawls 14. The electronic parts 8 are thus picked up by the suction nozzle 13.

After the pick up, the suction cam lever 47 rotates to raise the chuck mounting shaft 26 and the parts feed head 6 rotates one pitch. When the chuck mounting shaft 26 has returned to its raised position, the regulating pawls 14 close to some extent, but are not completely closed, because the pawl opening and closing ring 95 is still in a condition somewhat raised by the fixed cam 103a for pawl opening and closing. When the parts feed head 6 rotates, the chuck mounting shaft 26 gradually rises as shown by the cam curve line 46 of FIG. 11 along the fixed cam 44 for controlling vertical chuck motion and with which the cam follower 42 at the top end is engaged. As a result, the pawl opening and closing ring 95 moves down relatively with respect to the chuck mounting shaft 26 and the regulating pawls 14 gradually close. In this way, the regulating pawls 14 slowly grasp the electronic part 8 to perform a position regulating operation relative to the suction nozzle 13. The pawls 14 move the electronic part in one direction, i.e. the direction of a line between the pawls 14, to center the part 8 on the nozzle 13 in the one direction. Because the regulating pawls 14 slowly close, although a position regulation is performed, the electronic part 8 is not damaged. Also, because the pawls close during the rotation of the parts feed head 6 although they slowly close, the production tact is not lowered.

When the chuck mounting shaft 26 reaches the second stop position S2, the sensor 197 detects the rotational position of the chuck mounting shaft 26 to confirm that the chuck 9 is located at the original rotational position.

When the parts feed head 6 further rotates and the chuck mounting shaft 26 reaches the parts regulating position S3, the regulating pawls 106 of the parts position regulating apparatus 10 close to perform the positional regulation in a direction at right angles to the direction of the line between the regulating pawls 14 on the chuck 9. In this way, the position of the electronic part 8 is adjusted in two directions at right angles to each other. At this time the electronic part 8 moves between the regulating pawls 106 on the stationary parts position regulating apparatus 10 and moves out from between them again at the time of rotation of the parts feed head 6 without raising or lowering movement of the chuck 9. As a result, the rising and falling time may be shortened as compared with the conventional raising or lowering the suction head at the position of the parts regulating apparatus.

In the parts detecting position S4, the parts postured detecting apparatus 11 detects whether or not the electronic part 8 held on the chuck 9 is located within a given height range, whereby it is detected whether or not the part is held in a proper posture. When it is not held properly, this condition is memorized so that the part can be removed at the improperly postured parts removing position.

In the parts rotating position S5, the pivotal lever 63 of the chuck rotating apparatus 12 is pivoted to engage the chuck driving gear 36 with the chuck transmission gear 35 on the chuck mounting shaft 26 so as to rotate the chuck mounting shaft 26 by the pulse motor 68. Thus, the rotational angle $\theta$ of the part 8 relative to the circuit base plate 2 is set to the desired angle. It is to be noted that the chuck transmission gear 35 is rotatable only when the chuck driving gear 36 has been engaged with it, because the locking engagement of the rotation lock member 75 with gear 35 is released by the lock release dog 75'. Also, the chuck driving gear 36 is adapted to perform the next chuck rotation without returning to the original rotational position after having rotated the chuck 9. Therefore, because the position of the teeth on the chuck driving gear 36 in engagement with the teeth on the chuck transmission gear 35 is not always the same, local wear can be prevented.

In the parts mounting position S6, the chuck mounting shaft 26 is lowered by the cam lever 48 and the regulating pawls 14 open the same as at the pick up position. The electronic part 8 is pressed against the circuit base plate 2 by the suction nozzle 13 and is bonded thereto by the bonding agent on the circuit base plate 2. At this time, the valve operation lever 132 of the switching valve 120 is temporarily lowered by the vertical dog 136 and the switching valve 120 opens the positive pressure path. As a result, compressed air is supplied to the suction nozzle 13 and the electronic part 8 is separated from the suction nozzle 13 to prevent the electronic part from being improperly engaged with the base plate 2. When the posture has been judged improper in the parts detecting position S4, a cylinder 60 with a stopper thereon (FIG. 11) is operated to prevent the engaging cam lever 48 from lowering the chuck mounting shaft 26. The compressed air is not supplied, either. Thus, the improperly postured electronic parts 8 remain held by the suction nozzle 13.

In the chuck return rotating position S7, the pivotal lever of the chuck return rotating apparatus 12' pivots so that the chuck driving gear 36 engaged with the chuck transmission gear 35 of the chuck mounting shaft 26 to return the chuck mounting shaft 26 through an angle $-\theta$.

From the chuck return rotating position S7 to the parts removing position S8, the fixed cam 103$b$ for opening or closing the regulating pawls has a curved surface which gradually rises at a grade larger than the fixed cam 44 for vertical chuck movement. The pawl opening and closing ring 95 on the chuck mounting shaft 26 is thereby gradually raised. Therefore, the regulating pawls 14 open. Also, in the switching valve 120, the valve operation lever 132 is lowered from the position at the parts mounting position S6 by the operation of the cam 140 and the positive pressure path is opened. In the parts removing position S8, the positive pressure path 128 within the rotary frame (FIG. 18) is matched to the positive pressure path 129 within the housing so that compressed air is supplied to the suction nozzle 13. The electronic part 8 held on the suction nozzle 13 because of improper posture is then dropped into a parts receiving box 196 in the parts removing position S8.

In the detecting position S10 for detecting the original chuck rotation position, sensor 198 detects whether chuck 9 has returned to the original rotational position.

The above operation is repeatedly performed by each chuck 9. If an electronic part 8 is not picked up at the parts receiving positions S1, the cylinder 60 with the stopper thereon (FIG. 11) is operated to prevent the cam lever 47 from lowering the chuck mounting shaft 26.

Thus, the parts position regulating operation and the parts rotational angle regulating operation are divided and performed in the separate stop positions S3 and S5 of the parts mounting head 6, so that the stopping time of the parts mounting head 6 can be made shorter than in the case where both processes are performed at the same stop position.

Also, because one of two-direction positioning operations of the electronic parts 8 is performed by regulating pawls 14 on the chuck 9 and the other is performed by the regulating pawls 106 on the base stand 1, the parts can be moved between and out from between the regulating pawls 106 on the base stand 1 simply by the rotation of the parts feed head 6, and four regulating pawls are not disposed on the base stand. Therefore, the time may be reduced by the rising and lowering time of the suction nozzle 13, thus resulting in a much faster operation. For example, the operation time at one pitch position of the parts feed head 6 can be as short as approximately 0.25 seconds. Also, because a quicker opeation and the time to spare are provided, the regulating pawls 106 of the parts position regulating apparatus 10 may be slowly closed to prevent the electronic parts 8 from being damaged. Also, because the regulating pawls 14 on the chuck 9 are operated during the rotation of the parts mounting head 6, the time for position regulation thereby does not increase the overall operating time. The pawls may be slowly closed to prevent the electronic parts 8 from being damaged.

It is to be noted that in the embodiment the suction nozzle 13 is disposed on the rotating parts mounting head 6. The invention may be used even on an apparatus where a plurality of suction nozzles 13 are moved along an oval path or the other various curved paths.

Although the present invention has been fully described by way of example with reference to the accompanying drawings, it is to be noted here that various changes and modifications will be apparent to those skilled in the art. Therefore, unless otherwise such change and modifications depart from the scope of the present invention, they should be construed as being included therein.

What is claimed is:

1. A parts mounting apparatus, comprising:
    a plurality of suction nozzles for picking up and holding the parts;
    nozzle moving means on which said suction nozzles are mounted for intermittently moving said suction nozzles along a closed path to stop positions arranged at predetermined set intervals along said path, said stop positions including a parts pickup position at which parts are picked up by said suction nozzles and a parts mounting position at which parts are mounted on an article on which parts are to be mounted;
    a position adjusting means between the parts pickup position and the parts mounting position for adjusting the position of a part held on a suction nozzle to orient the part relative to the longitudinal axis of the suction nozzle, the adjustment being in two directions at right angles to each other and perpendicular to the longitudinal axis of the nozzle;
    a part posture detecting means at a stop position downstream of the position adjusting means in the direction from the parts pickup position to the parts mounting position, said detecting means having a line sensor means for detecting whether the posture of the parts relative to the suction nozzle axis is proper by sensing whether or not a part extends beyond a maximum position past the end of the corresponding nozzle; and
    a suction regulating means for controlling the suction to said suction nozzle for retaining or releasing the parts held by the suction nozzles at the parts mounting position in accordance with whether the posture detecting means has detected that the part held by a nozzle is proper or not.

2. An apparatus as claimed in claim 1 in which said nozzle moving means comprises a vertical shaft and a nozzle mounting head mounted on said shaft for being driving around said vertical shaft, said suction nozzles being mounted on said nozzle mounting head for vertical movement relative to said head.

3. An apparatus as claimed in claim 1 in which said position regulating means comprises first position regulating members mounted on each suction nozzle and movable in one direction transverse to the axis of the nozzle, and second position regulating members mounted at a stop position between said parts pickup position and the part posture detecting means and movable in a second direction at right angles to the first direction and transverse to the axis of the nozzle.

4. An apparatus as claimed in claim 3 in which said position regulation members are grasping members for grasping the parts from opposite sides.

5. An apparatus as claimed in claim 4 in which said first position regulating members are mounted on the respective suction nozzles for movement relative to the nozzle movement, and comprises means for moving the grasping members toward and away from each other with the relative movement of said position regulating member upwardly and downwardly on the corresponding suction nozzle.

6. An apparatus as claimed in claim 5 further comprising spring means normally urging said grasping members toward each other.

7. An apparatus as claimed in claim 1 in which said suction regulating means comprises means for supplying suction to the respective nozzles when they are in the stop positions other than the parts mounting position and in improperly postured parts discharge position next downstream from the parts mounting position, and for supplying compressed air to the nozzles in the parts mounting position when said posture detecting means indicates that the part on the nozzle is properly postured, and for supplying compressed air to the nozzles in the improperly postured parts discharge position.

8. An apparatus as claimed in claim 1 further comprising a nozzle rotating means positioned at a stop position downstream of the position adjusting means and upstream of said part posture detecting means, and comprising means for rotating the nozzles around the axis thereof.

9. An apparatus as claimed in claim 8 in which said nozzle rotating means comprises means engagable with a nozzle to rotate the nozzle, and locking means normally holding said nozzle in a fixed rotational position and which is disengaged by said rotating means when said rotating means engages said nozzle.

10. An apparatus as claimed in claim 8 further comprising a nozzle return rotating means at a stop position downstream of said parts mounting position and comprising means for rotating the nozzles around the axis thereof by an amount corresponding to the amount they are rotated by said nozzle rotating means and in the opposite direction from the direction in which the nozzles are rotated by said nozzle rotating means.

11. An apparatus as claimed in claim 10 in which said nozzle return rotating means comprises means engagable with a nozzle to rotate the nozzle, and locking means normally holding said nozzle in a fixed rotational position and which is disengaged by said rotating means when said rotating means engages said nozzle.

12. A parts mounting apparatus, comprising:
a plurality of suction nozzles for picking up and holding the parts;
nozzle moving means on which said suction nozzles are mounted for intermittently moving said suction nozzles along a closed path to stop positions arranged at predetermined set intervals along said path, said stop positions including a parts pickup position at which parts are picked up by said suction nozzles and a parts mounting position at which parts are mounted on an article on which parts are to be mounted;
a position adjusting means between the parts pickup position and the parts mounting position for adjusting the position of a part held on a suction nozzle to orient the part relative to the longitudinal axis of the suction nozzle, the adjustment being in two directions at right angles to each other and perpendicular to the longitudinal axis of the nozzle;
a part posture detecting means at a stop position downstream of the position adjusting means in the direction from the parts pickup position to the parts mounting position, said detecting means having a line sensor means for detecting whether the posture of the parts relative to the suction nozzle axis is proper by sensing whether or not a part extends beyond a maximum position past the end of the corresponding nozzle; and
a suction regulating means for controlling the suction to said suction nozzle for either releasing the parts held by the suction nozzles at the parts mounting position when the posture detecting means has detected that the posture of the part held by a nozzle is proper, or retaining the parts at the parts mounting position when the posture detecting means detects the posture of the parts is improper and releasing the parts from the suction nozzles before the suction nozzles reach the parts pickup position.

13. An apparatus as claimed in claim 12 further comprising a nozzle rotating means positioned at a stop position downstream of the position adjusting means and upstream of said part posture detecting means, and comprising means for rotating the nozzles around the axis thereof.

14. An apparatus as claimed in claim 12 further comprising a nozzle return rotating means at a stop position downstream of said parts mounting position and comprising means for rotating the nozzles around the axis thereof by an amount corresponding to the amount they are rotated by said nozzle rotating means and in the opposite direction from the direction in which the nozzles are rotated by said nozzle rotating means.

15. A parts mounting apparatus, comprising;
a plurality of suction nozzles for picking up and holding the parts;
a vertical shaft and a nozzle mounting head mounted on said shaft for being driven around said shaft and on which said suction nozzles are mounted for intermittently moving said suction nozzles along a closed path to stop positions arranged at predetermined set intervals along said path, said stop positions including a part pickup position at which parts are picked up by said suction nozzles and a parts mounting position at which parts are mounted on an article on which parts are to be mounted;

a position adjusting means between the parts pickup position and the parts mounting position for adjusting the position of a part held on a suction nozzle to orient the part relative to the longitudinal axis of the suction nozzle, the adjustment being in two directions at right angles to each other and perpendicular to the longitudinal axis of the nozzle;

a part posture detecting means at a stop position downstream of the position adjusting means in the direction from the parts pickup position to the parts mounting position, said detecting means having a line sensor means for detecting whether the posture of the parts relative to the suction nozzle axis is proper by sensing whether or not a part extends beyond a maximum position past the end of the corresponding nozzle;

a suction regulating means for controlling the suction to said suction nozzle for retaining or releasing the parts held by the suction nozzles at the parts mounting position in accordance with whether the posture detecting means has detected that the part held by a nozzle is proper or not; and a parts feed rotor rotatable around a vertical axis and having a plurality of parts feed cassettes detachably mounted around the periphery thereof, said cassettes each having a parts retaining tape having electronic parts in a row thereon wound around a reel accommodated therein and operable for intermittently moving the parts retaining tape for delivering the parts to an outlet portion, respective cassettes having different types of electronic parts accommodated therein, said parts feed rotor positioned so as to bring the outlet portions of the respective cassettes under a suction nozzle at the parts pickup position.

16. An apparatus as claimed in claim 15 further comprising a nozzle rotating means positioned at a stop position downstream of the position adjusting means and upstream of said part posture detecting means, and comprising means for rotating the nozzles around the axis thereof.

17. An apparatus as claimed in claim 15 further comprising a nozzle return rotating means at a stop position downstream of said parts mounting position and comprising means for rotating the nozzles around the axis thereof by an amount corresponding to the amount they are rotated by said nozzle rotating means and in the opposite direction from the direction in which the nozzles are rotated by said nozzle rotating means.

18. A parts mounting apparatus, comprising:
a plurality of suction nozzles for picking up and holding the parts;
a vertical shaft and a nozzle mounting head mounted on said shaft for being driven around said shaft and on which said suction nozzles are mounted for intermittently moving said suction nozzles along a closed path to stop positions arranged at predetermined set intervals along said path, said stop positions including a parts pickup position at which parts are picked up by said suction nozzles and a parts mounting position at which parts are mounted on an article on which parts are to be mounted;

a position adjusting means between the parts pickup position and the parts mounting position for adjusting the position of a part held on a suction nozzle to orient the part relative to the longitudinal axis of the suction nozzle, the adjustment being in two direcions at right angles to each other and perpendicular to the longitudinal axis of the nozzle;

a part posture detecting means at a stop position downstream of the position adjusting means in the direction from the parts pickup position to the parts mounting position, said detecting means having a line sensor means for detecting whether the posture of the parts relative to the suction nozzle axis is proper by sensing whether or not a part extends beyond a maximum position past the end of the corresponding nozzle;

a suction regulating means for controlling the suction to said suction nozzle for retaining or releasing the parts held by the suction nozzles at the parts mounting position in accordance with whether the posture detecting means has detected that the part held by a nozzle is proper or not; and a parts feed device movable in a closed path and having a plurality of parts feed cassettes detachably mounted around the periphery thereof, said cassettes each having a parts retaining tape having electronic parts in a row thereon wound around a reel accommodated therein and operable for intermittently moving the parts retaining tape for delivering the parts to an outlet portion, respective cassettes having different types of electronic parts accommodated therein, said parts feed device positioned so as to bring the outlet portions of the respective cassettes under a suction nozzle at the parts pickup position.

19. An apparatus as claimed in claim 18 further comprising a nozzle rotating means positioied at a stop position downstream of the position adjusting means and upstream of said part posture detecting means, and comprising means for rotating the nozzles around the axis thereof.

20. An apparatus as claimed in claim 18 further comprising a nozzle return rotating means at a stop position downstream of said parts mounting position and comprising means for rotating the nozzles around the axis thereof by an amount corresponding to the amount they are rotated by said nozzle rotating means and in the opposite direction from the direction in which the nozzles are rotated by said nozzle rotating means.

* * * * *